United States Patent
Chiang et al.

[11] Patent Number: 6,137,174
[45] Date of Patent: Oct. 24, 2000

[54] HYBRID ASIC/MEMORY MODULE PACKAGE

[75] Inventors: Kuo-Ning Chiang, Tao-Yen; Wen-Hwa Chen, Hsin-Chu; Kuo-Tai Tseng, Kao-Hsiang, all of Taiwan

[73] Assignee: ChipMOS Technologies Inc., Hsin-Chu, Taiwan

[21] Appl. No.: 09/318,943

[22] Filed: May 26, 1999

[51] Int. Cl.[7] .......................... H01L 23/48; H01L 23/52; H01L 29/40

[52] U.S. Cl. .......................... 257/734; 257/678; 257/693; 257/703; 257/705; 257/783

[58] Field of Search .................... 257/734, 703, 257/705, 678, 786, 693, 737, 738, 783

[56] References Cited

U.S. PATENT DOCUMENTS

| | | | |
|---|---|---|---|
| 5,744,863 | 4/1998 | Culnane et al. | 257/712 |
| 5,777,386 | 7/1998 | Higashi et al. | 257/734 |
| 5,796,170 | 8/1998 | Marcantonio | 257/693 |
| 5,909,058 | 6/1999 | Yano et al. | 257/712 |
| 5,939,783 | 8/1999 | Laine et al. | 257/702 |
| 5,952,719 | 9/1999 | Robinson et al. | 257/737 |
| 5,953,213 | 9/1999 | Napierala | 361/760 |

*Primary Examiner*—Mahshid Saadat
*Assistant Examiner*—Jhihan B Clark
*Attorney, Agent, or Firm*—H. C. Lin Patent Agent

[57] ABSTRACT

A package for multiple IC chip module. The IC chip is attached to electric wires on ceramic substrate which has good heat dissipating capability. The bonding pads along the periphery of the ceramic substrate are lead-bonded to a second substrate with printed wiring on at least one side of the surfaces and ball grid array at the bottom surface. Double-sided printed wiring can be used to provide multiple-layered interconnection. The IC chip is separated from the second substrate by a resin to cushion the stress due to difference in thermal expansion coefficients of the IC chip and the second substrate.

8 Claims, 4 Drawing Sheets

HYBRID ASIC/MEMORY MODULE PACKAGE

BACKGROUND OF THE INVENTION

This application is a continuation-in-part application of U.S. patent application Ser. No. 09/298,859, filed Apr. 26, 1999.

(1) Field of the Invention

This invention relates to integrated circuit package, in particular to multiple chip module (MCM) package.

(2) Description of the Related Art

As memory capacity of an integrated circuit chip increases from 4M, 16M, 64M, 128M to 256M, the manufacturing difficulty also increases and the manufacturing yield decreases. Another approach in increasing the memory capacity is to improve the packaging technique. For instance, a 128M memory can be obtained by packaging two 64M chips in one package, known as Multi-chip Module (MCM). In this manner, the yield can be increased and the manufacturing difficulty can be reduced.

Another popular packaging technique is the micro Ball Grid Array ($\mu$BGA) package. FIG. 1A shows the use of $\mu$BGA for a single IC chip 10. The IC chip 10 has bonding pads 12 along the periphery which are lead-bonded through bonding wires 16 to the bottom of substrate 14, as shown in FIG. 1B. The IC chip 10 is separated from the substrate 14 by a resin 15, which serves to cushion the difference in thermal expansion of the IC chip 10 and the substrate 14. The substrate 14 has ball grid array 18 at the bottom of the substrate 14 for surface mounting to a printed circuit board.

The structure shown in FIGS. 1A and 1B does not have provision to dissipate the heat generated in IC chip 10 because the resin 15 is a poor heat conductor. The problem is more serious for modern VLSI IC chip where large amount of heat may be generated.

Another limitation to packing density of the present-day structures is that the printed circuit wiring of the substrate for the $\mu$BGA is single-sided. Thus, the interconnection pattern is limited.

BRIEF SUMMARY OF THE INVENTION

An object of this invention is to increase the heat dissipation, routing capability and coplanarity of a MCM package. Another object of this invention is to provide a Ball Grid Array (BGA) package for MCM. Still another object of this invention is to increase the packing density and wiring flexibility of a BGA package.

These objects are achieved in this invention by using a ceramic substrate as a circuit board for the IC chips. The ceramic circuit board is then lead bonded to a second substrate with a ball grid array or solder connection array. The second substrate can be either a single-sided or a double-sided board. The IC chips are isolated from the second substrate with a resin cushion. Double-sided printed wiring can be used to provide layered interconnection for increased wiring flexibility and packing density.

DETAILED DESCRIPTION OF THE INVENTION

Figure 1A:
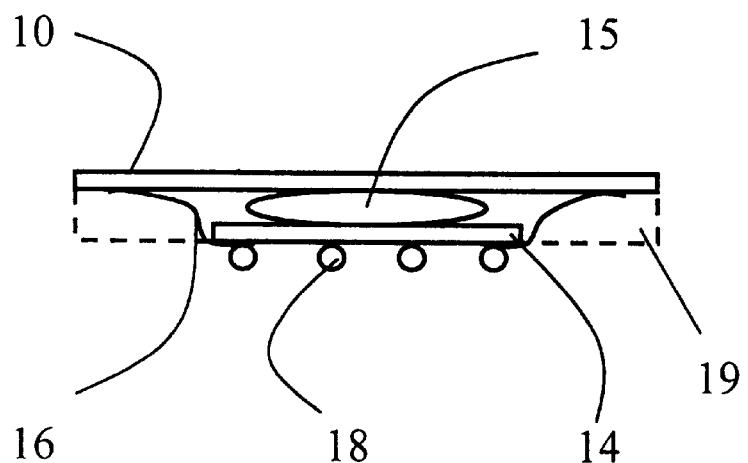
FIG. 1A shows the side view of a prior art BGA package.
Figure 1B:
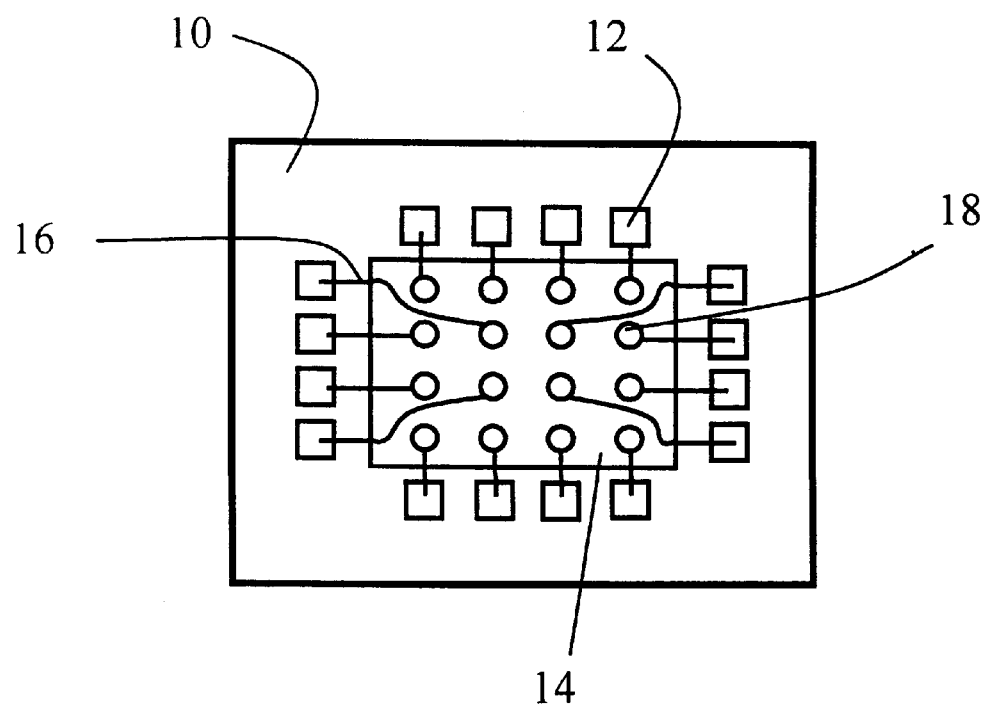
FIG. 1B shows a bottom view of the prior art BGA package.
Figure 2A:
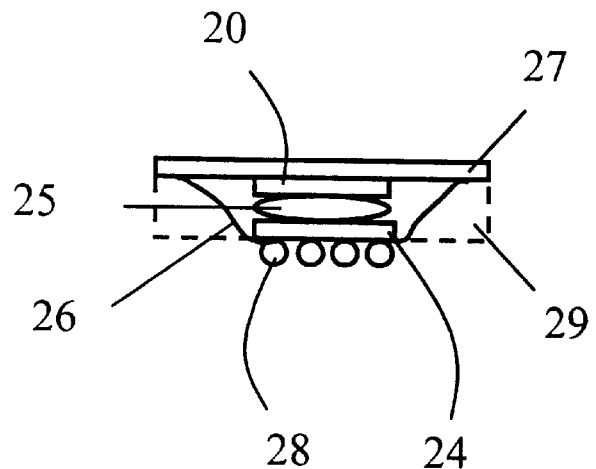
FIG. 2A shows the side view of a BGA package of the present invention.

FIG. 2A shows the side view of a BGA package for a single chip IC based on the present invention. A ceramic substrate 27 with electric wiring (not shown) is coupled to a flipped IC chip 20. The ceramic substrate 27 has greater heat dissipation capability than an organic substrate. A second substrate 24 with printed circuit and solder connection at the bottom serving as I/O terminals for the IC chip 20. The terminal bonding pads 22 for the IC chip 20 are placed at the periphery of the ceramic substrate 27 and lead-bonded through wires 26 to the bottom of substrate 24 for connection to the solder balls 28 at the bottom of substrate 24, serving as I/O terminals for the IC chip 20 as shown in the bottom view FIG. 2B.

The IC chip 20 is separated from the substrate 24 by a resin buffer 25, which serves as a cushion to reduce the effect of non-matching thermal expansion and contraction of the IC chip and the BGA substrate. The resin buffer can be a single body or multiple units.

Figure 3A:
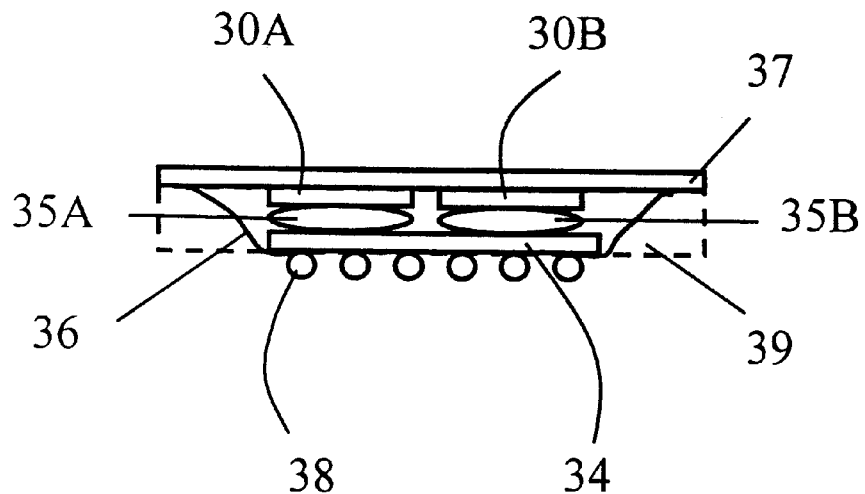
FIG. 3A shows a side view of a BGA package for multiple IC chips.

The structure can be sealed in a glue 29 to protect the IC chip 20, bonding wires 26, etc. and to protect against moisture in the air, FIG. 3A shows the side-view of a BGA package for multiple IC chips based on the present invention. A ceramic substrate 37 with electric wiring (not shown) is coupled to a number of IC chips such as 30A and 30B. A second substrate 34 with printed wiring and solder connection 38 at the bottom serving as I/O terminals for the IC chips 30A and 30B. The terminal bonding pads for the IC chips 30A and 30B are placed at the periphery of the ceramic substrate 37 and lead-bonded through wires 36 to the bottom of substrate 34 for connection to the solder balls 38 serving as I/O terminals for the IC chips 30A and 30B as shown in FIG. 3C.

The IC chips 30A and 30B are separated from the substrate 34 by two resin blocks 35A and 35B, respectively, which serve to reduce the effect of non-matching thermal expansion and contraction of the IC chips 30A, 30B and the substrate. The resin buffer can be a single block as shown in FIG. 3B or multiple blocks as shown in FIG. 3A.

The structure can be sealed in a glue 39 to protect the IC chips 30A, 30B, bonding wires, etc. and to protect against moisture in the air.

Figure 2B:
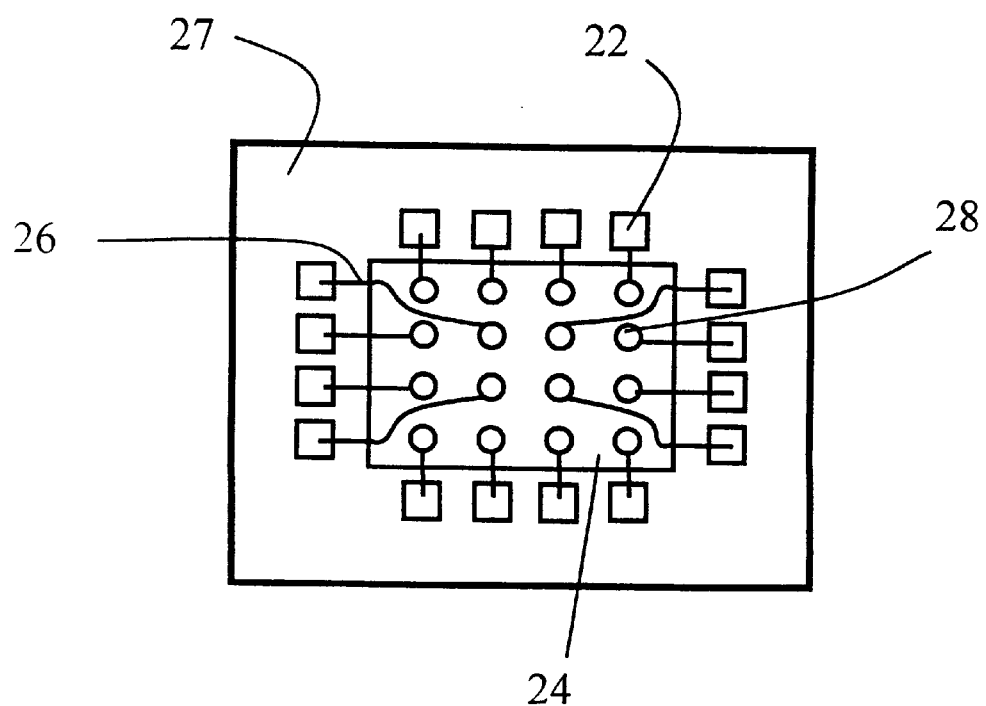
FIG. 2B show the bottom view of the BGA package shown in FIG. 2A.
Figure 3B:
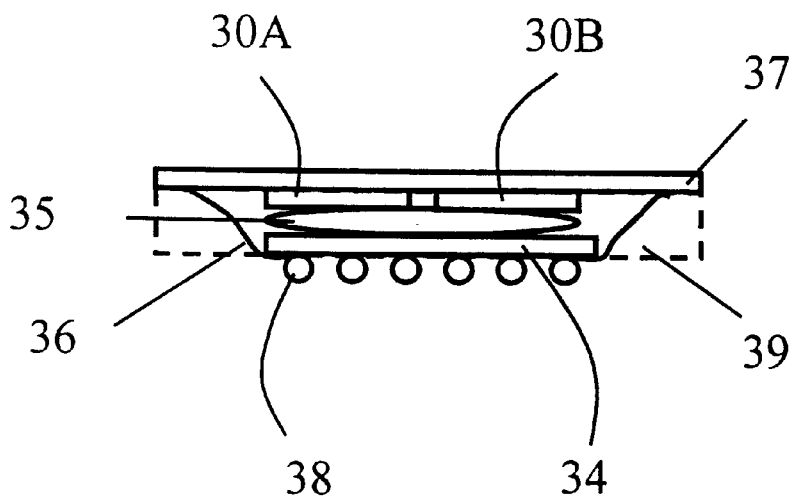
FIG. 3B shows another version of a BGA package for multiple IC chips.
Figure 3C:
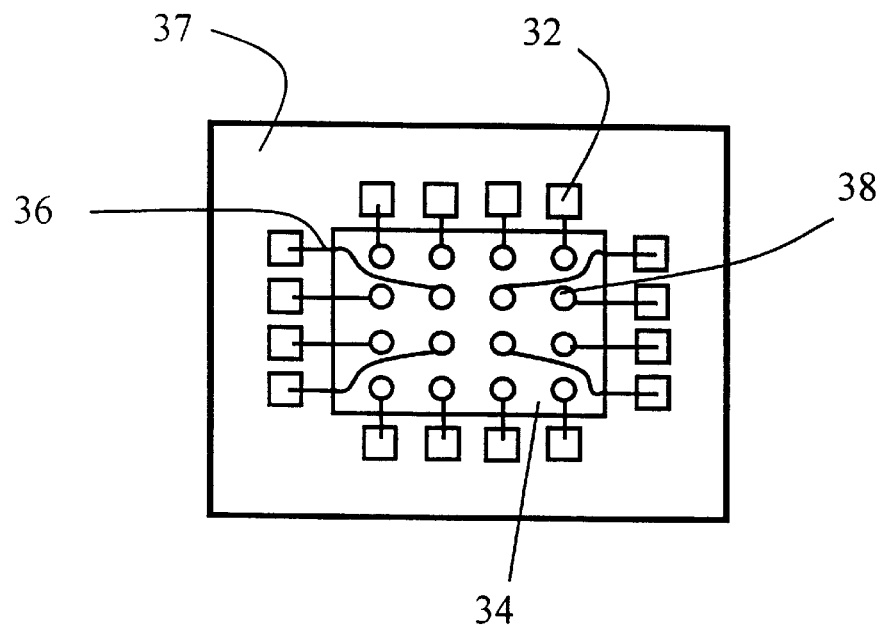
FIG. 3C shows the bottom view of the BGA package shown in FIG. 3A or 3B.
Figure 4:
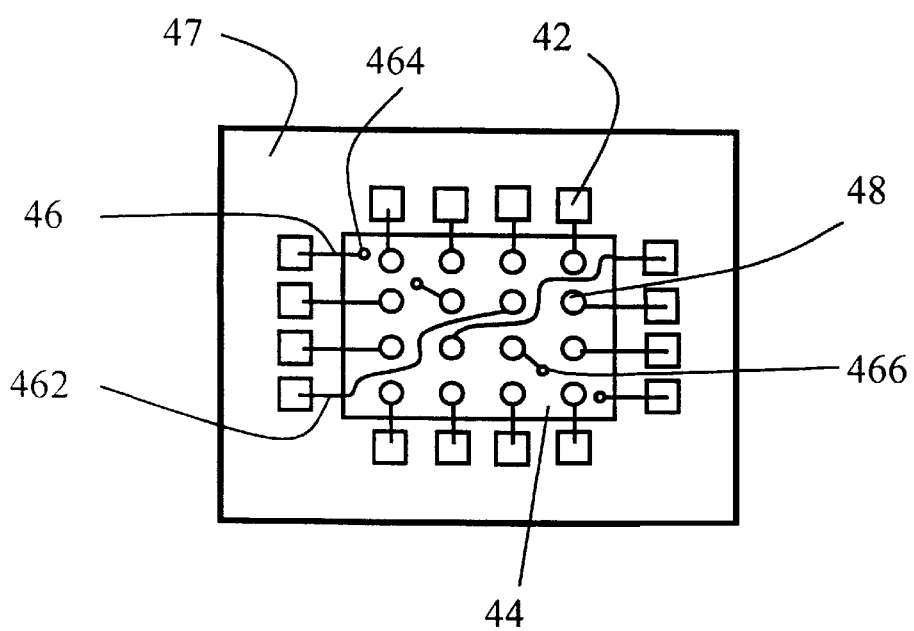
FIG. 4 shows the bottom view of a double-sided substrate for the BGA package shown in FIGS. 3A or 3B.

The BGA substrate 24 in FIG. 2B and the BGA substrate 34 in FIGS. 3A, 3B, 3C can be a single-sided printed-wiring or a double-sided printed wiring substrate 47 as shown in FIG. 4. With a two-sided printed wiring substrate, multiple-layered interconnection is made possible. In FIG. 4, the BGA substrate 44 is mounted below a ceramic substrate 47 with bonding pads 42 placed along the periphery of the ceramic substrate 47. Bonding wires such as wire 462 are connected to the solder balls such as solder ball 48. Other bonding wires such as wire 46 at the northwest corner of ceramic substrate 47 is intended to be connected to the southeast corner of the BGA substrate 44. However, a direct wire connection from the northwest corner of the ceramic substrate 47 to the southeast corner of the BGA substrate would require crossing the wire 462 and cause short-circuiting between wire 46 and wire 462. The problem is alleviated by using a double-sided multiple-layered printed wiring BGA substrate 44. With a double-sided printed wiring BGA substrate 44, the incoming lead wire 46 is connected through a via hole 464 to printed wiring on the top side of the BGA substrate 44. Through the printed wiring on the top of the BGA substrate 44 and another via hole 466, the lead wire 46 is made conductive to the southeast corner of the BGA substrate and be connected to an adjacent solder ball through a printed wire.

In the foregoing embodiments where ball grid array is used, it can be replaced with solder bumps or solder pads.

While particular embodiments of the invention have been described, it will be apparent to those skilled in the art that various modifications may be made in the embodiments without departing from the spirit of the present invention. Such modifications are all without the scope of this invention.

What is claimed is:

1. A solder connection package for integrated circuit (IC) chip, comprising:

at least one IC chip;

a ceramic substrate with electric wiring to which said IC chip is attached and with bonding pads along periphery;

a second substrate having printed wiring on at least one side of said substrate, to which the bonding pads of said ceramic substrate is lead-bonded and which has solder connection at the bottom surface connected to the printed wiring; and at least one resin block placed between said IC chip and said second substrate.

2. A solder connection package as described in claim 1, wherein said second substrate has printed wiring on the bottom side of said second substrate.

3. A solder connection package as described in claim 1, wherein there is only one said IC chip.

4. A solder connection package as described in claim 1, wherein said solder connection package is sealed in glue.

5. A solder connection package as described in claim 1, wherein there are two said IC chips and one said resin block.

6. A solder connection package as described in claim 1, wherein said printed wiring on both sides provides multiple-layer interconnection.

7. A solder connection package as described in claim 1, wherein the bonding pads of said ceramic substrate can be connected to said solder connection through a path comprising: a first via hole from the bottom surface to the top surface of said second substrate, a printed wire of said printed wiring on top of said second substrate, a second via hole from the top surface to the bottom surface of said second substrate, and a second printed wire at the bottom of said second substrate.

8. A solder connection package as described in claim 5, wherein there are two said IC chips and two said resin blocks.

\* \* \* \* \*